United States Patent [19]

Martin et al.

[11] Patent Number: 5,686,864
[45] Date of Patent: Nov. 11, 1997

[54] METHOD AND APPARATUS FOR CONTROLLING A VOLTAGE CONTROLLED OSCILLATOR TUNING RANGE IN A FREQUENCY SYNTHESIZER

[75] Inventors: Frederick L. Martin, Plantation; Cesar W. Carralero, Hialeah, both of Fla.

[73] Assignee: Motorola, Inc., Schaumburg, Ill.

[21] Appl. No.: 523,452

[22] Filed: Sep. 5, 1995

[51] Int. Cl.$^6$ .................... H03L 7/095; H03L 7/00
[52] U.S. Cl. .................. 331/1 A; 331/179; 331/17; 331/DIG. 2; 331/2; 327/159; 327/160; 327/107
[58] Field of Search .................. 331/2, DIG. 2, 331/57, 14, 1 A, 17, 10, 179; 327/107, 159, 160, 108 C

[56] References Cited

U.S. PATENT DOCUMENTS

| 4,270,213 | 5/1981 | Falk et al. | 455/77 |
| 4,574,243 | 3/1986 | Levine | 328/155 |
| 4,590,602 | 5/1986 | Wolaver | 331/1 A X |
| 4,714,899 | 12/1987 | Kurtzman et al. | 331/1 A |
| 4,764,737 | 8/1988 | Kaatz | 331/1 A |
| 5,389,898 | 2/1995 | Taketoshi et al. | 331/2 |

*Primary Examiner*—Robert Pascal
*Assistant Examiner*—Arnold Kinkead
*Attorney, Agent, or Firm*—Barbara R. Doutre

[57] ABSTRACT

A frequency synthesizer (100, 500) provides multiple selectable voltage controlled oscillator (VCO) frequency ranges. A VCO control circuit (114) controls the selectable VCO frequency ranges based on lock conditions of selected VCOs within a VCO array (112) or a single variable VCO circuit (502), to provide an extended tuning range to the frequency synthesizer (100, 500).

14 Claims, 7 Drawing Sheets

METHOD AND APPARATUS FOR CONTROLLING A VOLTAGE CONTROLLED OSCILLATOR TUNING RANGE IN A FREQUENCY SYNTHESIZER

TECHNICAL FIELD

This invention relates in general to frequency synthesizers and more specifically to voltage controlled oscillator circuits used in frequency synthesizers.

BACKGROUND

Recent radio technology trends have focused on producing highly integrated products that operate at lower voltages. The advantages associated with these trends include smaller packaging and lower current drain consumption. However, the use of low voltage high density integrated circuit technologies presents problems to the electrical designer including low breakdown thresholds and limited available supply range for the circuit design. Present day radio frequency (RF) synthesizer circuits requiring a wide tuning range are typically achieved using one to two manually selected VCO circuits, each employing a very high tuning voltage, typically around 12–15 volts. Careful characterization and/or trim operations of these VCOs are required in order to cover a fixed frequency range. The required tuning operations and characterizations currently performed are expensive and are not readily applicable in a monolithic environment.

Achieving a wide tuning loop bandwidth in an all-integrated synthesizer presents the issue of controlling an integrated VCO over a wide tuning range. With the advent of lower operating supply voltages and lower breakdown voltages in integrated circuit (IC) technologies, there is a need for an improved VCO circuit to adapt to this new environment.

DETAILED DESCRIPTION OF THE PREFERRED EMBODIMENT

Figure 1:
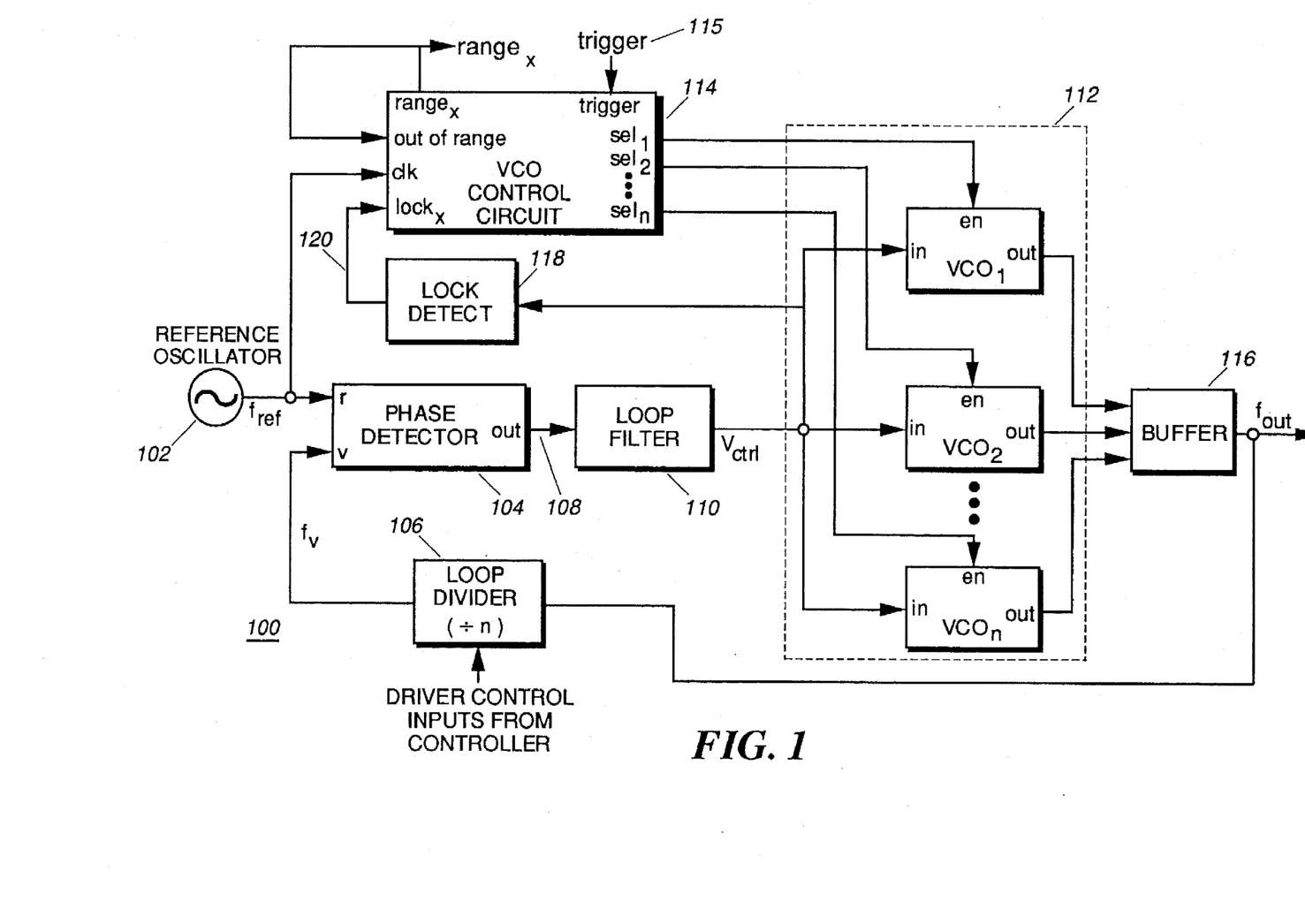
FIG. 1 shows an electrical block diagram of a frequency synthesizer in accordance with a first embodiment of the present invention.

FIG. 1 of the accompanying drawings shows a block diagram of a frequency synthesizer 100 in accordance with a first embodiment of the present invention. A reference frequency signal, $f_{ref}$, generated from a reference oscillator 102 is received at phase detector 104. Phase detector 104 phase compares the reference frequency signal, fref, to a divided output frequency, $f_v$, received from a loop divider 106. Phase detector 104 generates an error signal 108 which is transferred to loop filter 110. The loop filter 110 generates a control voltage signal, Vctrl, in response to the error signal 108. In accordance with the present invention, the control voltage signal, Vctrl, is used as an input to a plurality of voltage controlled oscillator (VCO) circuits 112 ($VCO_1$–$VCO_n$). In accordance with the present invention, a VCO control circuit 114 alternately enables each of the plurality of VCO circuits 112 through select ports ($sel_1$–$sel_n$) in order to alternately generate output frequencies with which the synthesizer 100 can attempt to lock on frequency. Thus, VCO control circuit 114 provides for the automatic selection of a VCO frequency from amongst a plurality of selectable VCO frequency ranges. The plurality of VCO circuits 112 will also be referred as a VCO array 112. The VCOs within VCO array 112 preferably have overlapping frequency ranges to provide a wideband tuning range for synthesizer 100.

The VCO control circuit 114 begins an iteration of alternately enabling and disabling individual VCOs within VCO array 112 in response to a trigger signal 115 generated from a trigger source (not shown), such as a controller. The output frequency generated from a currently enabled VCO is fed through buffer 116 as output frequency, $f_{out}$, and then fed back to loop divider 106. Loop divider 106 receives inputs from a controller (not shown) which programs the loop divider to divide the output frequency, $f_{out}$, by a predetermined amount (/n). The divided output frequency, $f_v$, is then fed back to phase detector 104. By individually enabling the VCOs one at a time as described by the invention, the tuning range provided to synthesizer 100 extends across the overlapping frequency ranges of the plurality of VCOs 112.

The synthesizer 100 also includes a means of detecting locked and unlocked synthesizer conditions, preferably through a lock detect circuit 118 which uses the control voltage signal, $V_{ctrl}$, to determine whether the synthesizer 100 has locked on frequency with a currently enabled VCO circuit. Lock detect circuit 118 generates a lock indicator signal 120 indicating either a locked or unlocked condition and feeds the lock indicator signal to the VCO control circuit 114. VCO control circuit 114 continues to alternately enable and disable each of the plurality of VCO circuits 112 until the lock indicator signal 120 indicates that the synthesizer has locked on frequency with one of the VCOs. Once the synthesizer 100 has locked on frequency, the currently selected VCO, loop divider 106, phase detector 104, and loop filter 110 generally form a locked phase lock loop (PLL). The phase lock loop maintains divided frequency output signal, $f_v$, in phase with the frequency signal, $f_{ref}$, by producing the error signal 108 at the phase detector output which manipulates the currently selected VCO to correct for differences between $f_v$ and $f_{ref}$.

In accordance with the present invention, VCO control circuit 114 can also track the number of the currently enabled VCO relative to the total number of VCOs within VCO array 112. Once each of the VCOs within VCO array 112 has been alternately enabled without a successful lock, an out of range indicator, $range_x$, enables an out of range condition that terminates the alternate enabling and disabling process. The out of range indicator is also preferably coupled back to a controller (not shown) to inform the controller that no successful lock was achieved with any of the selected VCO circuits within VCO array 112. Hence, the VCO control circuit 114 as described by the invention can continue to make attempts to lock the synthesizer 100 on frequency until either a lock condition is met or an out of range condition is indicated. When the VCOs within VCO array 112 provide different yet overlapping tuning ranges, the synthesizer 100 can provide a wideband voltage controlled oscillator tuning range. The iterative process can be restarted with a new trigger signal 115 which resets the VCO control circuit 114.

The frequency synthesizer 100 is preferably fabricated using bipolar-complimentary metal oxide semiconductor (Bi-CMOS) technology as part of a single integrated circuit (IC). Other IC technologies, such as gallium arsenide (GaAs) or bipolar, also lend themselves well to providing the wide tuning range achieved by providing multiple selectable integrated VCO circuits. Using the array of VCO circuits described by the invention, eliminates the need for a single VCO with a large tuning voltage range, a practice common in synthesizers with a wide frequency range in present art. Hence, the integrated circuit design makes synthesizer 100 attractive for low voltage applications, particularly those using operating voltages below 3 volts. By using the VCO control circuit 114 described by the invention to automatically select and de-select VCO frequency ranges within synthesizer 100, the need for VCO characterization and trimming is minimized. The VCO control circuit 114 and lock detect circuit 118 may be implemented in a number of ways with the preferred embodiments to be described herein. While the first embodiment describes a series of VCOs having partially overlapping tuning ranges, one skilled in the art realizes that there may be applications where it is desirable to have gaps between some of the tuning ranges.

Figure 2:
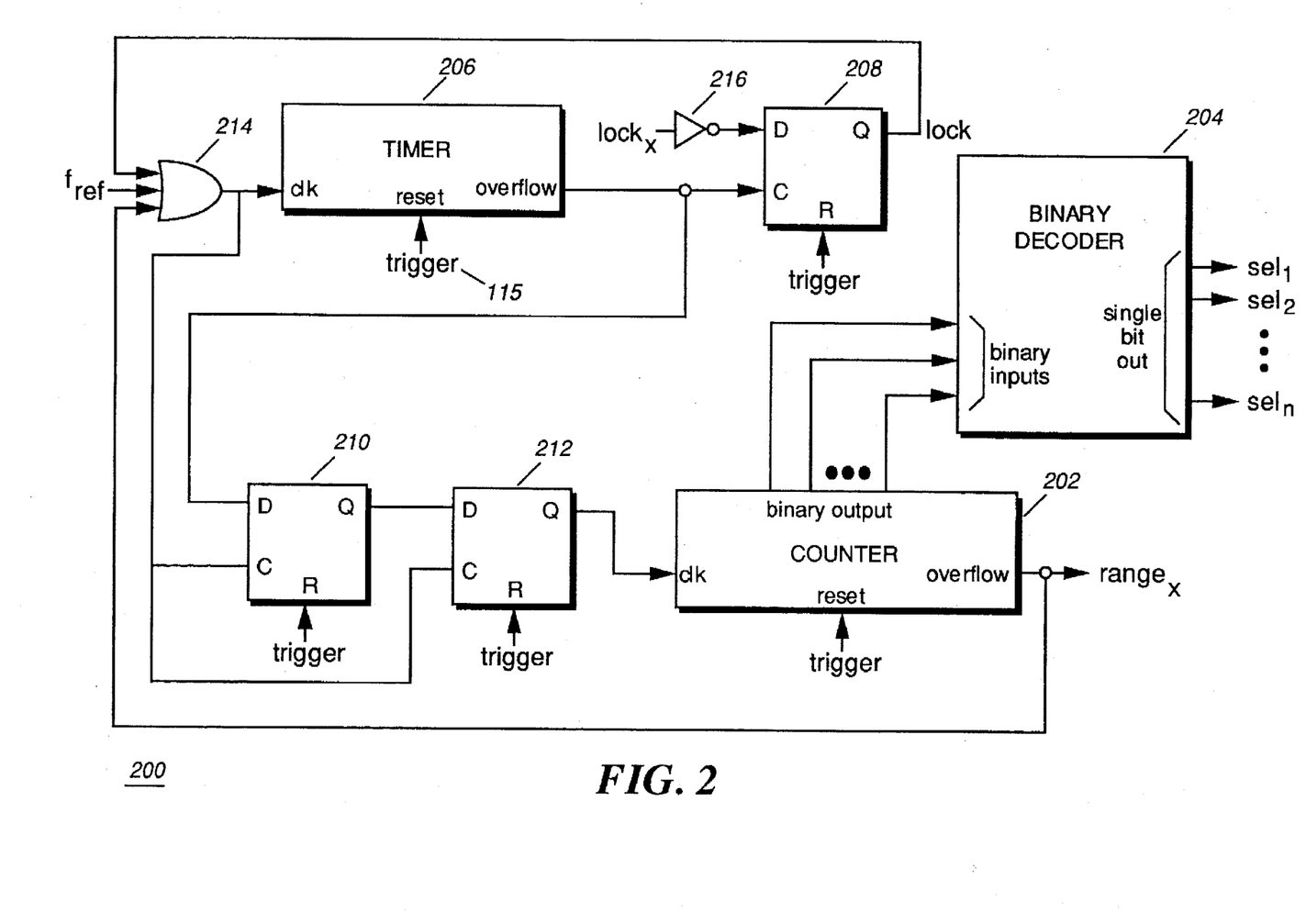
FIG. 2 shows an electronic circuit diagram of a voltage controlled oscillator (VCO) control circuit in accordance with the preferred embodiment of the present invention.

Referring now to FIG. 2, there is shown a preferred implementation of the VCO control circuit in accordance with the present invention. Common signal names have been maintained between FIGS. 1 and 2 where applicable. The VCO control circuit 200 preferably includes a counter 202, a binary decoder 204, a timer 206, first, second, and third flip-flops 208, 210, 212, shown as D flip-flops, an OR gate 214, and an inverter 216. In operation, the number of the selected (active) VCO is stored in the contents of the counter 202 and provided as a binary output to the binary decoder 204. The binary decoder 204 receives the binary input and transmits a single bit output to pins $sel_1$–$sel_n$. The selection process is initiated by input signal trigger 115, preferably generated by a controller (not shown), which resets all counters and flip-flops in the design. At initiation, the value stored in counter 202 is 0, resulting in a logic high setting for output $sel_1$. At the time of initiation, timer 206 begins counting clock cycles of the frequency reference signal, $f_{ref}$. The combination of the length of the clock cycle time and the period of the frequency reference signal are used to produce a time delay greater than the settling time of the synthesizer. When timer 206 completes its cycle, an overflow output is set to a logic high, clocking a first flip-flop 208. When clocked, first flip-flop 208 stores the lock indicator signal, $lock_x$, from the lock detector of FIG. 1 which is first inverted through inverter 216. If the phase lock loop locks with the currently selected VCO frequency ($lock_x$ set to a logic level low), the first flip-flop lock output signal is set to a logic level high, and the clock input, clk, of the timer 206 is disabled through logic gate 214, and the value at the select outputs, $sel_1$–$sel_n$, is latched and held. If the phase lock loop fails to lock with the currently selected VCO frequency ($lock_x$ is set to a logic level high), the overflow output of timer 206 enables first and second delay producing flip-flops 210 and 212 which in turn cause counter 202 to increment its binary output count. The incremented count of counter 202 allows the binary decoder 204 to increment to the next select output, in this case $sel_2$. This process is repeated until a lock condition is reached or until counter 202 overflows. An overflow condition at counter 202 exists when its overflow output, $range_x$, is a logic level high which terminates the search process through logic gate 214. The $range_x$ signal is also preferably fed back to a controller (not shown) to indicate that an out of range condition exists.

Figure 3:
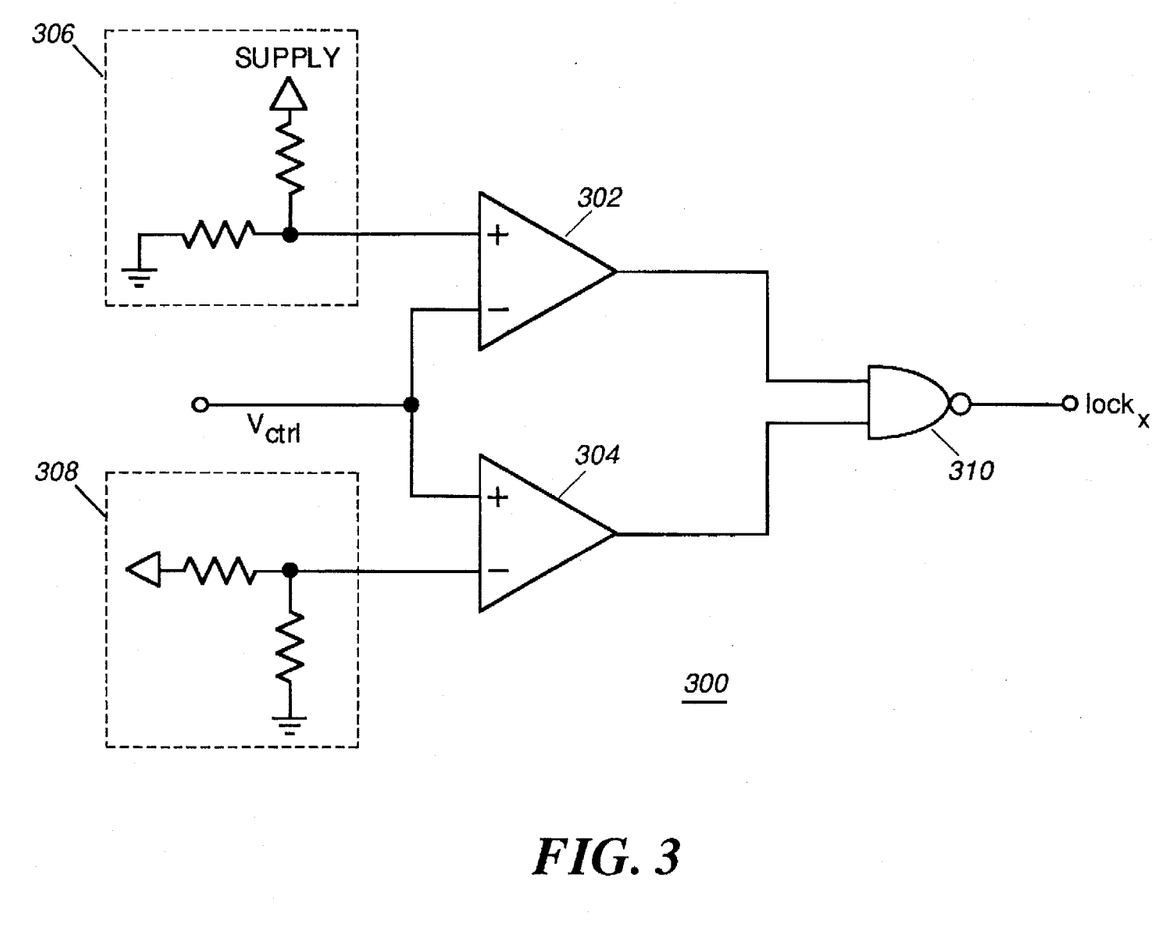
FIG. 3 shows an electronic circuit diagram of a lock detect circuit in accordance with the preferred embodiment of the present invention.

FIG. 3 shows an electrical circuit diagram of the preferred embodiment of the lock detect circuit in accordance with the present invention. Common signal names have been maintained between FIGS. 1 and 3 where applicable. The lock detect circuitry 300 preferably comprises first and second comparators 302, 304, a first voltage divider 306 coupled to the non-inverting input of the first comparator 302, and a second voltage divider 308 coupled to the inverting input of the second comparator 304. A logic gate, NAND gate 310, is preferably coupled to the outputs of the first and second comparators 302, 304 to provide the lock detect signal, $lock_x$. The analog lock detect circuitry 300 samples the control voltage, Vctrl, generated at the output of the loop filter 110 of FIG. 1 and compares it to preset threshold limits of first and second comparators 302 and 304. The phase lock loop of FIG. 1 will cause the control voltage, Vctrl, to approach either supply or ground, when the PLL is unlocked. This feature reduces the variations in loop dynamics over frequency and temperature. First voltage divider 306 determines the upper limit threshold of first comparator 302 while second voltage divider 308 determines the lower limit threshold of second comparator 304. Comparator 302 generates a logic level high (supply) signal when the control voltage, Vctrl, is lower than the upper limit threshold. When the control voltage is higher than the upper limit threshold, the first comparator 302 generates a logic level low (ground). Second comparator 304 generates a logic level high when the control voltage, Vctrl, is higher than the lower limit threshold and a logic level low signal otherwise. The NAND gate 310 generates a logic level low only when both inputs are high, when the control voltage, Vctrl, is between the upper and lower limit thresholds. This is an indication that the synthesizer 100 is locked on frequency. When the NAND gate 310 output is a logic level high the synthesizer 100 is unlocked.

While the lock detector 300 has been described using an analog approach, an alternate digital implementation can also be realized by sampling the edges of the error signal 108 at the output of the phase detector 104. This digital sampling technique is described in a U.S. Pat. No. 4,764,787 by Kaatz entitled "Frequency Synthesizer Having Phase Detector with Optimal Steering and Level-Type Lock Indication" and is hereby incorporated by reference. In this implementation, the VCO frequency ranges are preferably increasing monotonically, and by sampling the edges of the error signal 108, positive and negative out of lock conditions can be determined. This allows the control circuit 114 to do a non-sequential search through the VCO array 112, skipping several VCO circuits at a time, when an unlocked condition occurs. Thus, it is not necessary for each VCO circuit to be enabled in order to determine out of range conditions. Various other lock detect schemes available in the art can also be employed to determine lock and unlocked conditions of the frequency synthesizer.

It may also be desirable for a controller (not shown) to store information as to which VCO actually locks on frequency. Thus, when control circuit 114 is re-triggered it can respond by starting a non-sequential search with the last enabled VCO that locked on frequency. By restarting the search with the last enabled VCO, lock times can potentially be reduced.

Figure 4:
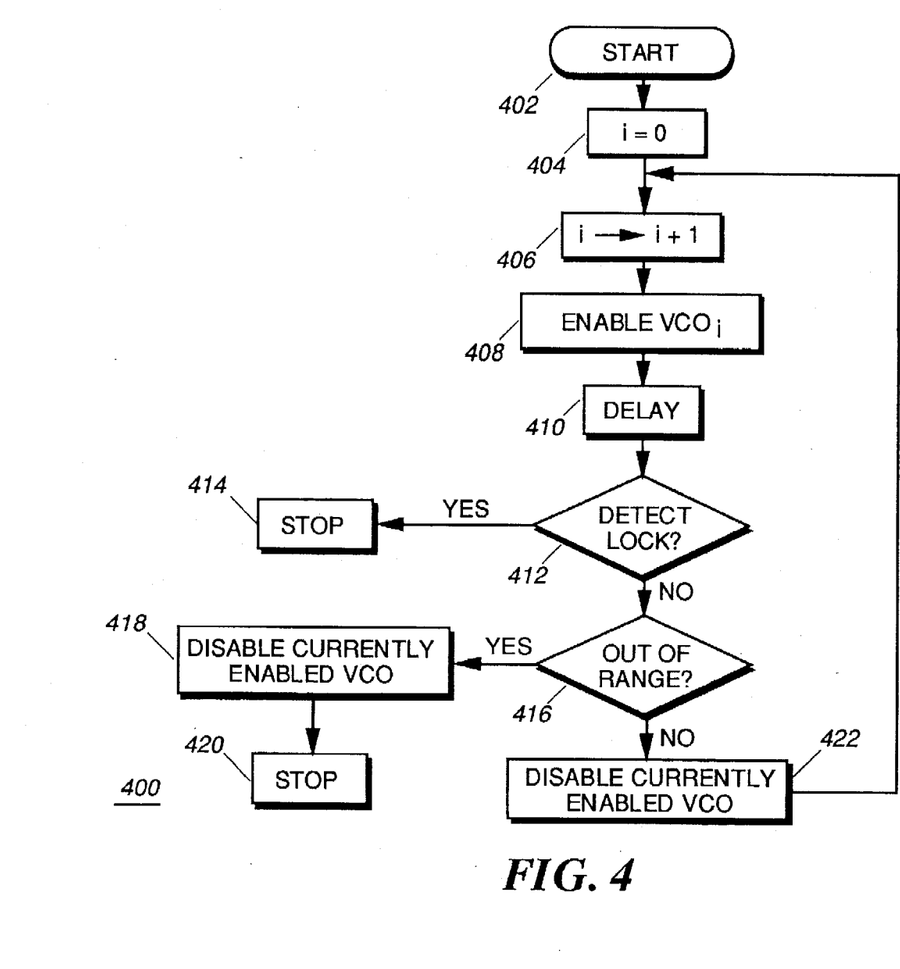
FIG. 4 shows a flowchart of an iterative process for controlling a voltage controlled oscillator (VCO) tuning range in accordance with the present invention.

Referring now to FIG. 4, there is shown a flowchart of an iterative process 400 for controlling a VCO tuning range in a frequency synthesizer in accordance with the present invention. Step 402 starts the iterative process 400 by resetting all the VCO control circuits, step 404 sets a counter to a predetermined value, in this case a value of zero (i=0), and step 406 increments the counter by a predetermined value, in this case by an increment of 1. Step 408 enables $VCO_i$ and then delays the clock for a predetermined amount of time, for example 100 microseconds at step 410. Step 412 determines if a lock condition is detected and if so, terminates the iterative process at step 414. If a lock condition is not detected at step 412, an out of range condition is then checked at step 416. Step 416 determines if an out of range condition is present by comparing the counter to a predetermined threshold. If an out of range condition is met, the currently enabled VCO is disabled at step 418 and the iterative process is stopped at step 420. If an out of range condition is not determined in step 416, the currently enabled VCO is disabled at step 422, and the iterative process is returned to step 406 where the counter is incremented to enable a new VCO at step 408. When the tuning ranges from one VCO to the next partially overlap, the result of the iterative process is a broadband VCO tuning range within which the frequency synthesizer can lock.

As previously described, it may also be desirable to sequence through the VCOs in a non-sequential manner, even skipping several VCOs at a time. The iterative process 400 can be adapted to respond to positive and negative unlocked conditions in order to provide the non-sequential search through the VCOs. Thus, the iterative process can be adapted to suit specific application needs.

Figure 5:
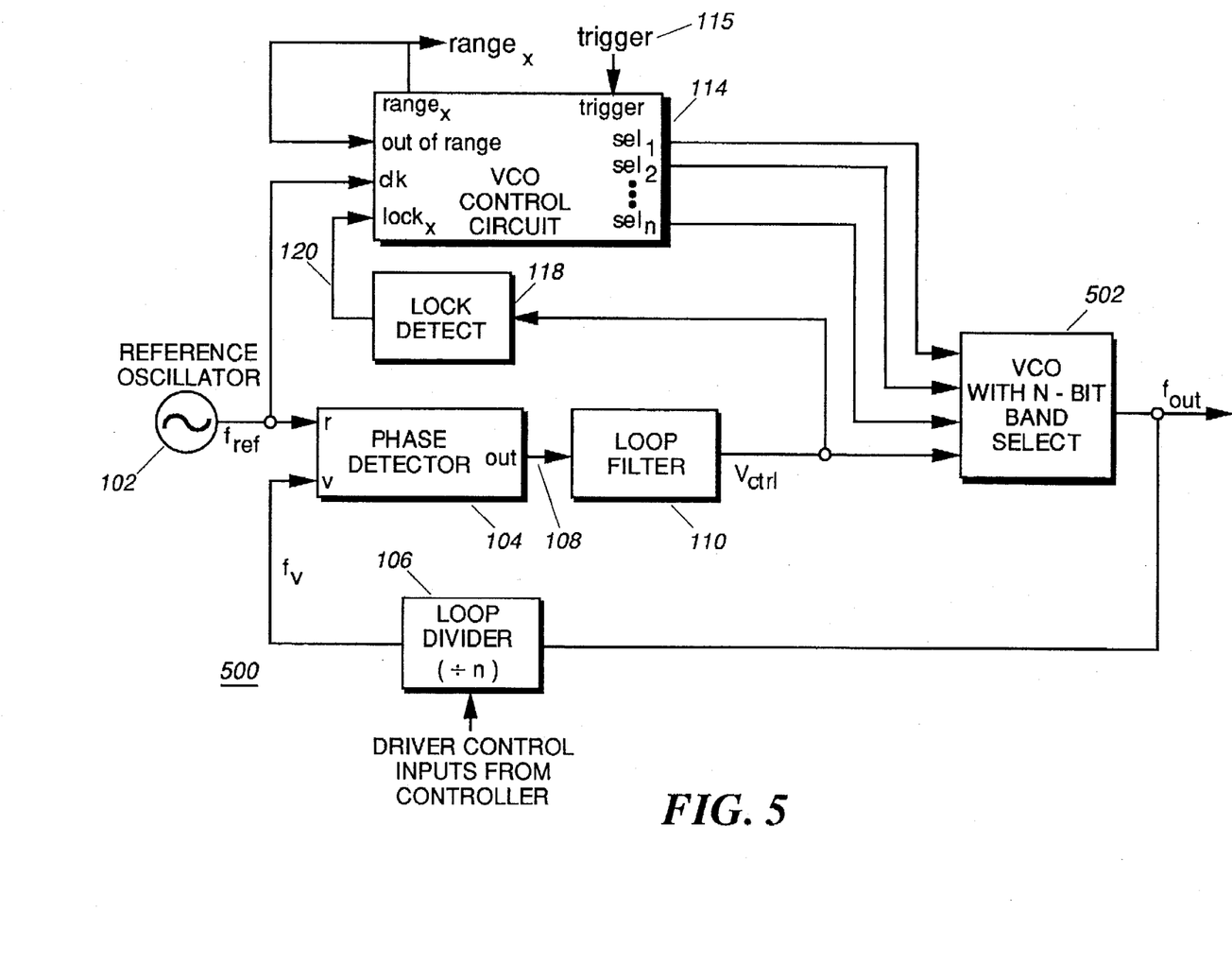
FIG. 5 shows an electrical block diagram of an alternative embodiment of a frequency synthesizer in accordance with the present invention.

While the preferred embodiment of the invention has been illustrated and described, it will be clear that the invention is not so limited. While the preferred embodiment of synthesizer circuit 100 shows separate VCO circuits coupled in a parallel like fashion off the VCO control circuit 114, an alternative approach could include a single VCO with multiple pin switches or switched varactor tuning ranges to provide a plurality of selectable VCO tuning frequencies. This alternative embodiment of the frequency synthesizer is shown in FIG. 5 of the accompanying drawings. Like reference designators have been used between FIGS. 1 and 5 where applicable. In accordance with this alternative embodiment, frequency synthesizer 500 includes VCO control circuit 114 and lock detect circuit 118 to control a phase lock loop formed of phase detector 104, loop filter 110, loop divider 106, and a variable voltage controlled oscillator (VCO) 502 preferably having an N-bit band selection. Variable VCO 502 is shown in more detail in the electronic circuit diagram of FIG. 6. Once again, in accordance with the present invention, the VCO control circuit 114 provides for the automatic selection of a VCO frequency from amongst a plurality of selectable VCO frequency ranges within synthesizer 500. By determining unlocked conditions and using these conditions to control a plurality of selectable VCO frequency ranges, a broad overall tuning range is provided to synthesizer 500.

Figure 6:
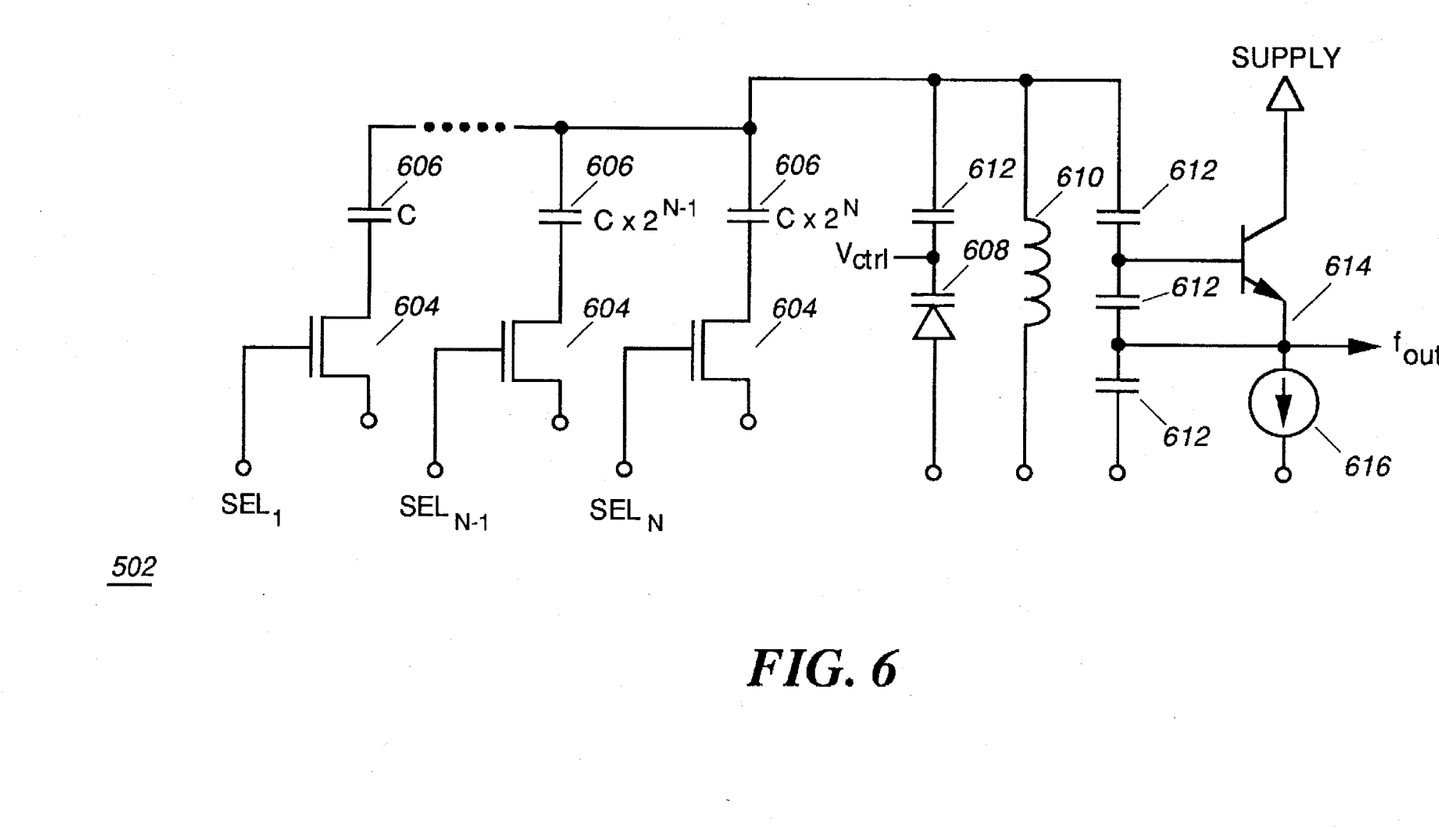
FIG. 6 shows an electronic circuit diagram of the VCO of FIG. 5 in accordance with the alternative embodiment of the present invention.

Referring now to FIG. 6, variable VCO 502 generally includes capacitors 612, varactor 608, resonator 610, transistor 614, and current sink 616. Other biasing circuitry has been omitted for simplicity. In accordance with this alternative embodiment of the invention, variable VCO 502 further includes switches 604, preferably field effect transistors (FETs), which are enabled through select lines $sel_1$–$sel_n$ from the VCO control circuit 114. FETs 604 selectively engage capacitors (C through $C_x 2^n$) 606 either singularly or in combinations thereof to provide various selectable tuning ranges to synthesizer 500. The VCO control circuit 114 of FIG. 1 can be implemented to provide the N-bit binary outputs to select ports ($sel_1$–$sel_n$) as opposed to the single bit binary output described in the embodiment of FIG. 2. Hence, the single variable VCO 502 provides fine tuning over a broad range of selectable tuning frequencies with which to lock synthesizer 500.

Figure 7:
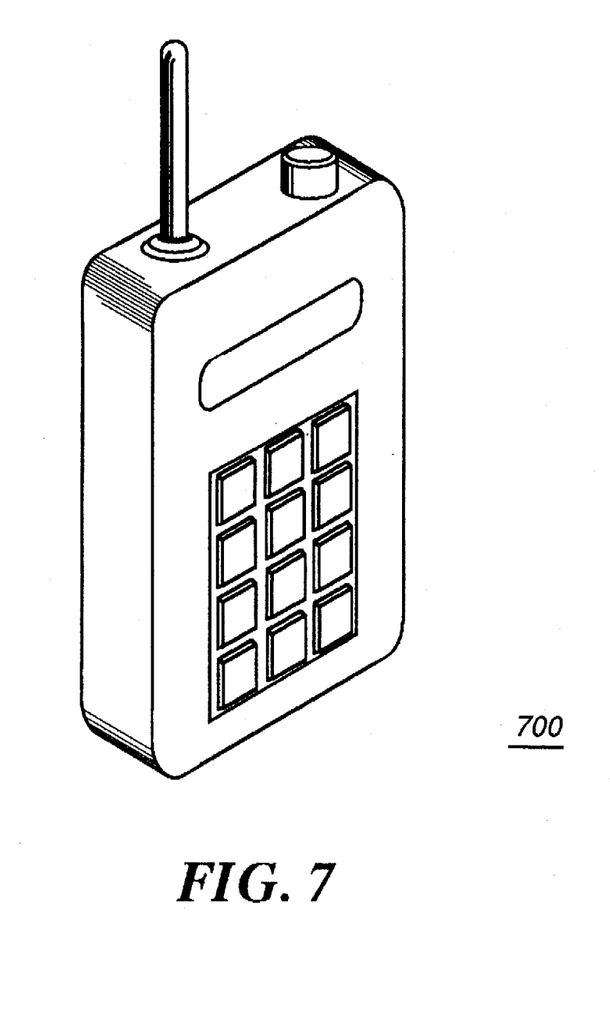
FIG. 7 shows a communication device utilizing the present invention.

In FIG. 7, a communication device such as a two way radio 700 is shown. Radio 700 includes conventional transmitter, receiver, and controller circuits for transmitting and receiving information. Preferably, radio 700 includes a frequency synthesizer having a selectable VCO tuning range as described by the invention. Thus, radio 700 provides the benefit of a broad range of tuning frequencies with which to obtain communication links. Other communication devices such as televisions and cellular telephones can also benefit from the improvements provided by the frequency synthesizer having selectable tuning ranges described by the present invention.

Accordingly, wideband frequency synthesizers can now be achieved by implementing and controlling multiple VCOs or a single variable VCO as described by the invention. By using a VCO array or a single variable VCO and determining out of lock conditions, the need for individual VCO characterization and trim operations is significantly reduced. The iterative process of controlling a VCO tuning range, as described by the invention, allows a single integrated synthesizer to cover a broader range of communication applications and hence has a greater appeal in the market place than present day synthesizers.

Numerous other modifications, changes, variations, substitutions, and equivalents will occur to those skilled in the art without departing from the spirit and scope of the present invention as defined by the appended claims.

What is claimed is:

1. A phase lock loop (PLL) for a frequency synthesizer, comprising:

a reference oscillator providing a first frequency input signal;

a phase detector for comparing the phase of the first frequency input signal to a second frequency input signal and generating an error signal;

a loop filter coupled to said phase detector, said loop filter providing a control voltage in response to the error signal;

a plurality of voltage controlled oscillator (VCO) circuits receiving the control voltage;

a VCO control circuit for individually enabling and disabling each of the plurality of VCO circuits, said plurality of VCO circuits each individually generating an output frequency in response to being-enabled, the VCO control circuit including a delay means for determining the settling time of each individually enabled VCO circuit;

a lock detect circuit for determining, based on the control voltage, if the frequency synthesizer has locked on frequency with one of the plurality of VCO circuits, said VCO control circuit ceasing to individually enable and disable each of the plurality of VCO circuits once the frequency synthesizer has locked on frequency; and a loop divider for dividing each generated output frequency by a predetermined amount and feeding a divided frequency back to the phase detector as the second frequency input signal.

2. A phase lock loop (PLL) for a frequency synthesizer as described in claim 1, wherein the VCO control circuit includes a counter for tracking the number of each individually enabled VCO circuit, said VCO control circuit being disabled once the number reaches a predetermined overflow limit.

3. A phase lock loop (PLL) for a frequency synthesizer as described in claim 1, wherein the VCO control circuit individually enables and disables each of the plurality of VCO circuits in a non-sequential manner.

4. A phase lock loop (PLL) for a frequency synthesizer, comprising:

a reference oscillator providing a first frequency input signal;

a phase detector for comparing the phase of the first frequency input signal to a second frequency input signal and generating an error signal;

a loop filter coupled to said phase detector, said loop filter providing a control voltage in response to the error signal;

a plurality of voltage controlled oscillator (VCO) circuits receiving the control voltage:

a VCO control circuit for individually enabling and disabling each of the plurality of VCO circuits, said plurality of VCO circuits each individually generating an output frequency in response to being enabled;

a lock detect circuit for determining, based on the control voltage, if the frequency synthesizer has locked on frequency with one of the plurality of VCO circuits, said VCO control circuit ceasing to individually enable and disable each of the plurality of VCO circuits once the frequency synthesizer has locked on frequency;

a loop divider for dividing each generated output frequency by a predetermined amount and feeding a divided frequency back to the phase detector as the second frequency input signal; and wherein the lock detect circuit compares the control voltage to predetermined threshold limits to generate a lock indicator signal, the lock indicator signal indicating either a locked or unlocked synthesizer condition, said VCO control circuit individually enabling and disabling each of the plurality of VCO circuits in response to the lock indicator signal indicating an unlocked condition.

5. A phase lock loop (PLL) for a frequency synthesizer, comprising:

a reference oscillator providing a first frequency input signal;

a phase detector for comparing the phase of the first frequency input signal to a second frequency input signal and generating an error signal;

a loop filter coupled to said phase detector, said loop filter providing a control voltage in response to the error signal;

a plurality of voltage controlled oscillator (VCO) circuits receiving the control voltage;

a lock detect circuit responsive to the control voltage for generating a lock detect signal indicating a locked condition or an unlocked condition of the PLL;

a VCO control circuit responsive to the lock detect signal for selectively enabling and disabling each of the plurality of VCO circuits, one at a time, until a locked condition is indicated by the lock detect signal, the VCO control circuit ceasing to selectively enable and disable each of the plurality of VCO circuits when each of the plurality of VCO circuits has been selectively enabled without a locked condition being indicated by the lock detect signal;

the plurality of VCO circuits each providing a selectively generated output frequency in response to being enabled; and a loop divider for dividing each selectively generated output frequency by a predetermined amount anal feeding a divided output frequency back to the phase detector as the second frequency input signal.

6. A phase lock loop (PLL) for a frequency synthesizer as described in claim 5, wherein the plurality of VCO circuits provide partially overlapping frequency ranges.

7. A voltage controlled oscillator (VCO) tuning circuit for a frequency synthesizer, including:

a plurality of VCOs, each providing different and partially overlapping frequency ranges, said plurality of VCOs each generating an output frequency in response to being enabled;

a VCO control circuit alternately enabling and disabling each of said plurality of VCOs to provide a tuning range within which the frequency synthesizer can lock on frequency; and wherein the VCO control circuit includes a means for tracking the number of each alternately enabled VCO, said VCO control circuit being disabled in response to the number reaching a predetermined overflow limit.

8. A VCO tuning circuit for a frequency synthesizer as described in claim 7, wherein the frequency synthesizer locks on frequency with one of the alternately enabled VCOs, and the VCO control circuit ceases alternately enabling and disabling the plurality of VCOs once the frequency synthesizer locks on frequency.

9. A VCO tuning circuit for a frequency synthesizer as described in claim 7, further including:

a lock detect circuit for determining whether the frequency synthesizer has locked on frequency with one of the plurality of VCOs, said lock detect circuit generating a lock indicator signal indicating either a locked or unlocked condition of the frequency synthesizer, said VCO control circuit alternately enabling and disabling each of the plurality of VCOs when an unlocked condition is indicated, and said VCO control circuit terminating the alternate enabling and disabling of the plurality of VCOs when a locked condition is indicated.

10. A VCO tuning circuit for a frequency synthesizer as described in claim 7, wherein the VCO control circuit includes a delay circuit for maintaining each alternately enabled VCO enabled for a predetermined time.

11. A method of tuning a frequency synthesizer to lock on to a frequency, comprising the steps of:

generating a control voltage;

providing the control voltage to a plurality of voltage controlled oscillator (VCO) circuits having different yet overlapping frequency ranges;

alternately enabling and disabling each of the plurality VCO circuits;

alternately generating an output frequency from each of the alternately enabled VCO circuits in response to the control voltage;

determining if the frequency synthesizer has locked on frequency with each alternately generated output frequency; and ceasing the alternate enabling and disabling of the plurality of VCO circuits once the frequency synthesizer has locked on frequency; and wherein the step of determining further includes the steps of:

incrementing a counter when the frequency synthesizer fails to lock on frequency with the alternately generated output frequency; and terminating the alternate enabling and disabling of the plurality of VCO circuits once the counter reaches a predetermined overflow limit.

12. A method of tuning a phase lock loop (PLL) in a frequency synthesizer, comprising the steps of:

providing a plurality of selectable voltage controlled oscillator (VCO) frequency ranges;

automatically selecting a VCO frequency from the plurality of selectable VCO frequency ranges;

attempting to lock the PLL on frequency with the selected VCO frequency;

checking whether the PLL has locked on frequency with the selected VCO frequency;

automatically de-selecting the selected VCO frequency after a predetermined time within which the PLL fails to lock on frequency;

repeating in a non-sequential manner the step of automatically selecting through the step of de-selecting until one of the plurality of selectable VCO frequency ranges locks the PLL on the selected VCO frequency; and ceasing the step of repeating when a predetermined number of attempts to lock the PLL on frequency have been made.

13. A method of tuning a PLL in a frequency synthesizer as described in claim 12, wherein the plurality of selectable VCO frequency ranges are partially overlapping.

14. A phase lock loop (PLL) for a frequency synthesizer, comprising:

a reference oscillator providing a first frequency input signal;

a phase detector for comparing the phase of the first frequency input signal to a second frequency input signal and generating an error signal;

a loop filter coupled to said phase detector, said loop filter providing a control voltage in response to the error signal;

a plurality of voltage controlled oscillator (VCO) circuits receiving the control voltage;

a VCO control circuit for individually enabling and disabling each of the plurality of VCO circuits, said plurality of VCO circuits each individually generating an output frequency in response to being enabled, the VCO control circuit including a counter for tracking the number of each individually enabled VCO circuit, said VCO control circuit being disabled once the number reaches a predetermined overflow limit;

a lock detect circuit for determining, based on the control voltage, if the frequency synthesizer has locked on frequency with one of the plurality of VCO circuits, said VCO control circuit ceasing to individually enable and disable each of the plurality of VCO circuits once the frequency synthesizer has locked on frequency; and a loop divider for dividing each generated output frequency by a predetermined amount and feeding a divided frequency back to the phase detector as the second frequency input signal.

* * * * *